United States Patent
Ludwig et al.

(10) Patent No.: US 7,108,798 B2
(45) Date of Patent: Sep. 19, 2006

(54) DEFECT REPAIR METHOD, IN PARTICULAR FOR REPAIRING QUARTZ DEFECTS ON ALTERNATING PHASE SHIFT MASKS

(75) Inventors: Ralf Ludwig, München (DE); Martin Verbeek, München (DE)

(73) Assignee: Infineon Technologies AG, (DE)

( * ) Notice: Subject to any disclaimer, the term of this patent is extended or adjusted under 35 U.S.C. 154(b) by 282 days.

(21) Appl. No.: 10/668,375

(22) Filed: Sep. 24, 2003

(65) Prior Publication Data
US 2004/0124175 A1    Jul. 1, 2004

(30) Foreign Application Priority Data
Sep. 24, 2002   (DE) ................ 102 44 399

(51) Int. Cl.
*B44C 1/22*    (2006.01)
*G03F 1/00*    (2006.01)
(52) U.S. Cl. ............................... 216/52; 430/5
(58) Field of Classification Search ............ 216/12, 216/52; 430/5
See application file for complete search history.

(56) References Cited

FOREIGN PATENT DOCUMENTS
JP    2002214760 A    7/2002

OTHER PUBLICATIONS

M. Verbeek, R. White; High Precision Mask repair Using Nanomachining, pp. 210-217, 18th European Mask Conference on Mask Technology Jan. 15-16, 2002 Munich, Germany.*
C. Friedrich, et al., Defect Printability and Repair of Alternating Phase Shift Masks, Abstract, pp. 19-26, date unknown, but prior to the filing of this application.
M. Verbeek, ert al., High Precision Mask Repair Using Nanomachining, Abstract, pp. 187-194, date unknown, but prior to the filing of this application.

* cited by examiner

*Primary Examiner*—Parviz Hassanzadeh
*Assistant Examiner*—Roberts Culbert
(74) *Attorney, Agent, or Firm*—Banner & Witcoff, Ltd.

(57) ABSTRACT

The invention relates to a defect repair method, in particular for repairing quartz defects on alternating phase shift masks, wherein, for repairing defects (5) existing on one and the same component (1), both, defect repair method steps substantially based on mechanical processes (S3), in particular nanomachining method steps, and defect repair method steps substantially based on etching processes (S2), in particular FIB (Focused Ion Beam) method steps, are used. Moreover, the invention relates to a component (1), in particular a photomask, repaired by making use of such a defect repair method.

18 Claims, 3 Drawing Sheets

Figure 1:
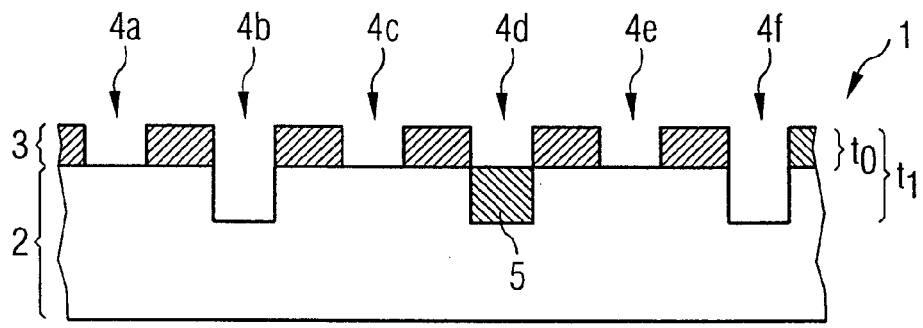

DEFECT REPAIR METHOD, IN PARTICULAR FOR REPAIRING QUARTZ DEFECTS ON ALTERNATING PHASE SHIFT MASKS

The invention relates to a defect repair method, in particular a method for repairing quartz defects on alternating phase shift masks, in accordance with the preamble of claim 1, as well as to a component, in particular a photomask, repaired by making use of such a defect repair method.

For manufacturing semiconductor devices, in particular silicon semiconductor devices, so-called photolithographic methods may e.g. be used.

With these methods, first of all the surface of the corresponding wafer—consisting of monocrystalline silicon—is subject to an oxidation process, and subsequently a light-sensitive photoresist layer is applied to the oxide layer.

Subsequently—by interconnecting an appropriate optical device—a photomask is placed above the wafer, the structure of which corresponds to the structure to be provided on the wafer.

Then, the photomask—and thus also the corresponding structure on the photoresist—is exposed, and then the photomask is removed again.

When the photoresist is then developed and subject to an etching process, the exposed positions of the photoresist (and the respective positions of the oxide layer thereunder) are removed from the wafer—and the non-exposed ones are left.

Through the exposed windows, the monocrystalline silicon can now specifically be supplied with impurities, e.g. by corresponding diffusion or ion implantation processes; n-conductive regions may, for instance, be produced by the introduction of pentavalent atoms, e.g. phosphorus, and p-conductive regions may be produced by the introduction of trivalent atoms, e.g. boron.

The structures that can be put into practice by means of conventional photolithographic methods may range within the wavelengths of the light used for exposure.

In order to produce even smaller structures, so-called alternating phase shift masks may, for instance, be used instead of conventional photomasks.

Alternating phase shift masks comprise e.g. a quartz layer and a layer of chrome positioned on top of the quartz layer.

For producing an alternating phase shift mask, the chrome layer (positioned on top) is first of all provided—in a manner known per se—with a structure that corresponds to the structure which is to be provided on the wafer (i.e. the chrome layer is completely removed at the corresponding positions).

Subsequently, at every second of the structures produced, in particular at the structure lines, the quartz layer is additionally etched away to a predetermined depth (so that the quartz layer structure produced thereby is—alternatingly—more or less deep).

If such a mask is used as photomask during the exposure of a silicon wafer, it is possible to achieve that light waves passing through adjacent structure lines—and thus through correspondingly more or less deep quartz layers—are phase-twisted by 180° vis-à-vis each other, this making it possible that—due to interference effects between the light waves—correspondingly sharper-limited intensity maxima of the light waves on the silicon wafer can be produced than with the use of conventional photomasks.

Therefore, relatively narrow or small structures can be put into practice on the silicon wafer by means of an alternating phase shift mask (e.g. structures of distinctly less than 100 nm, e.g. 90 nm, when light with a wavelength of 248 nm is used).

During the manufacturing of alternating phase shift masks, defects in the structure of the quartz layer may occur.

A corresponding particle positioned on the phase shift mask may, for instance, prevent the quartz layer from being etched away in the region positioned under the particle. This causes an—undesired—elevation, i.e. a so-called "quartz bump", to occur.

For repairing quartz defects or quartz bumps, respectively, a so-called nanomachining method may, for instance, be used.

Such a method is e.g. known from M. Verbeek, R. White, M. Klos: "High precision mask repair using nanomachining", Proceedings of the 18th European Mask Conference, GMM Technical Report Vol. 36, VDE Publishing House 2002, and e.g. from M. Laurance: "Subtractive Defect Repair via Nanomachining", 20th Annual BACUS Symposium on Photomask Technology (2000), Proceedings of SPIE Vol. 4186, p. 670.

There, a quartz defect or quartz bump, respectively, is removed mechanically by means of a diamond tip of an AFM (AFM=Atomic Force Microscope).

In this method, the target level of the removal process (i.e. the desired depth of the quartz layer structure) can be defined and observed precisely.

However, since the AFM tips taper (to a point) towards the bottom, the quartz layer cannot be removed, or be removed incompletely only, in deep regions positioned relatively closely to the edge of the structure, which—during the later use of the corresponding mask—will lead to transmission losses.

Instead of a nanomachining method, a method based on focused ion beam (FIB or Focused Ion Beam, respectively) may also be used for repairing quartz defects or quartz bumps, respectively.

Such a method is e.g. known from C. Friedrich, M. Verbeek, L. Mader, C. Crell, R. Pforr, U. A. Griesinger: "Defect Printability and Repair of Alternating Phase Shift Masks", Proceedings of the 16th European Mask Conference, GMM Technical Report Vol. 30, VDE Publishing House 1999, and e.g. from D. Kakuta, I. Kagami, T. Komizo, H. Ohnuma: "Quantitative Evaluation of Focused Ion-Beam Repair for Quartz Bump Defect of Alternating Phase-Shift Masks", 21st Annual BACUS Symposium on Photomask Technology (2002), Proceedings of SPIE Vol. 4562, p. 753.

There—by means of a focused ion beam supplied by an ion beam device—a gas supplied by a gas injector is spontaneously stimulated to etch at the position of the quartz defect; the—undesired—quartz bump is thus removed by an etching process.

In this method, relatively extensive regions can be removed relatively quickly. Moreover, the quartz layer may also be removed neatly in deep regions positioned close to the edge of the structure—up to close to the structure boundary.

However, the etching rate in the region of the edges of the quartz defect is higher than in the remaining, inner quartz defect region.

If the inner region of the quartz defect is removed to target level (i.e. to the desired depth of the quartz layer structure), quartz beyond the target level is removed in the edge region of the quartz defect.

Thus, a ditch in the quartz (a so-called "river bed") occurs around the former quartz defect, this causing transmission losses during the later use of the corresponding mask to occur.

It is an object of the invention to provide a novel defect repair method, in particular a novel method for repairing quartz defects on alternating phase shift masks (and a component, in particular a photomask, repaired by making use of such a defect repair method).

This and further objects are achieved by the subject matters of claims 1 and 13.

Advantageous further developments of the invention are indicated in the subclaims.

In accordance with a basic idea of the invention, a defect repair method, in particular for repairing quartz defects on alternating phase shift masks, is provided, wherein, for repairing defects on one and the same component, in particular one and the same mask, both, defect repair method steps that are substantially based on mechanical processes, and defect repair method steps that are substantially based on etching processes, are used.

It is of particular advantage when the defect repair method steps that are substantially based on mechanical processes are nanomachining method steps, and the defect repair method steps that are substantially based on etching processes are FIB (Focused Ion Beam) method steps.

In a preferred embodiment of the invention, first of all the defect repair method steps that are substantially based on etching processes, in particular FIB method steps, are performed; subsequently, the defect repair method steps that are substantially based on mechanical processes, in particular nanomachining method steps, are performed.

It is of advantage when, during the defect repair method steps that are performed first of all and that are substantially based on etching processes, in particular FIB method steps, a corresponding defect is not repaired or is only partially repaired, respectively, at an edge region, and when the edge region of the defect—that first had not been repaired or had been repaired partially only—is then removed during the subsequently performed defect repair method steps that are substantially based on mechanical processes, in particular nanomachining method steps.

Thereby, the overetching in the edge region of the quartz defect—that occurs with conventional FIB methods—may be avoided (i.e. the development of a "river bed").

Since the edge region of the quartz defect that is removed later on by making use of a nanomachining method has relatively small dimensions, repair time and tip consumption can be substantially reduced vis-à-vis conventional nanomachining methods.

Figure 2:
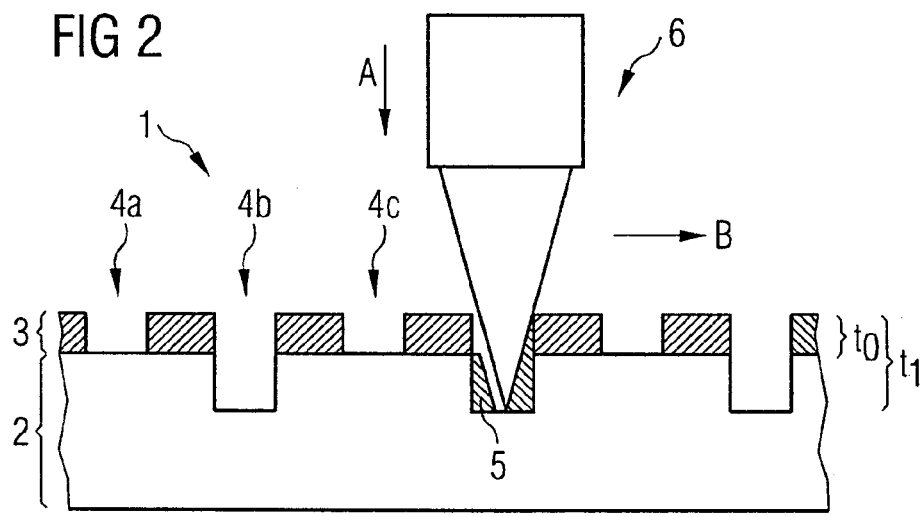
Figure 3:
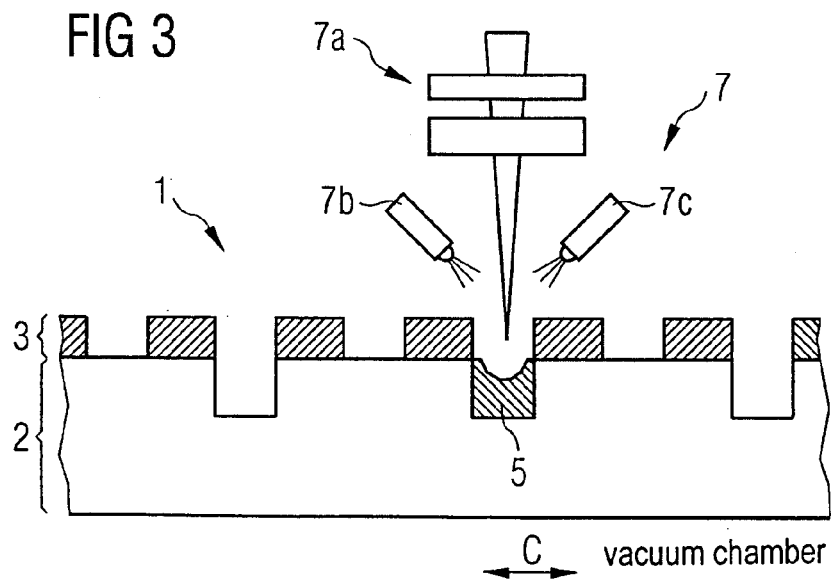
Figure 4:
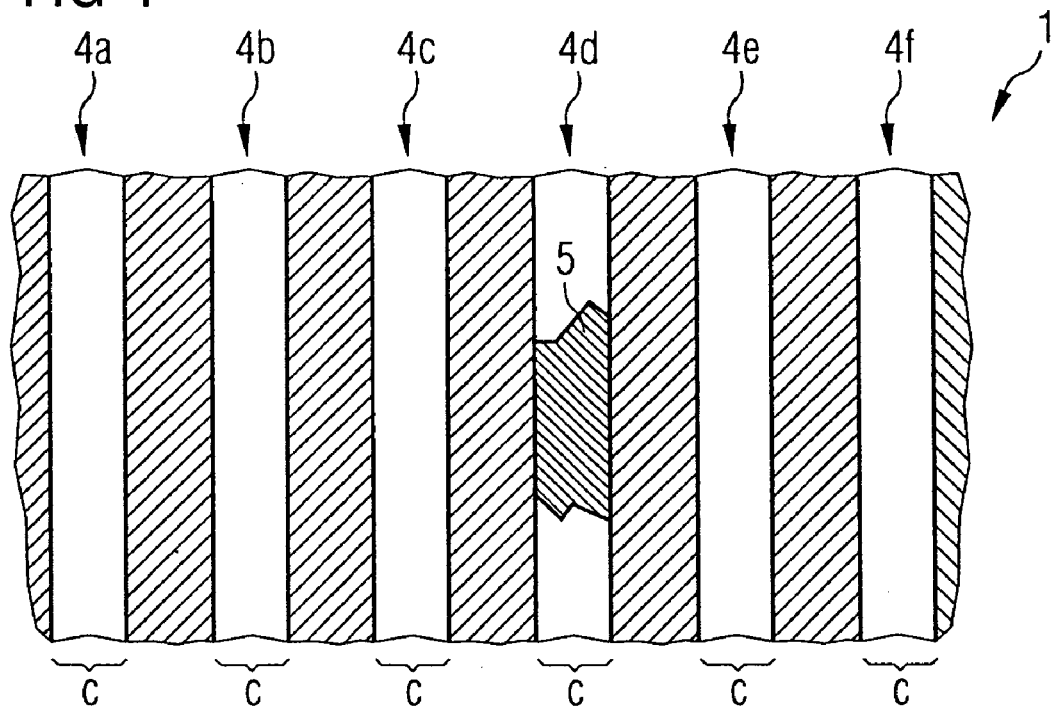
Figure 5:
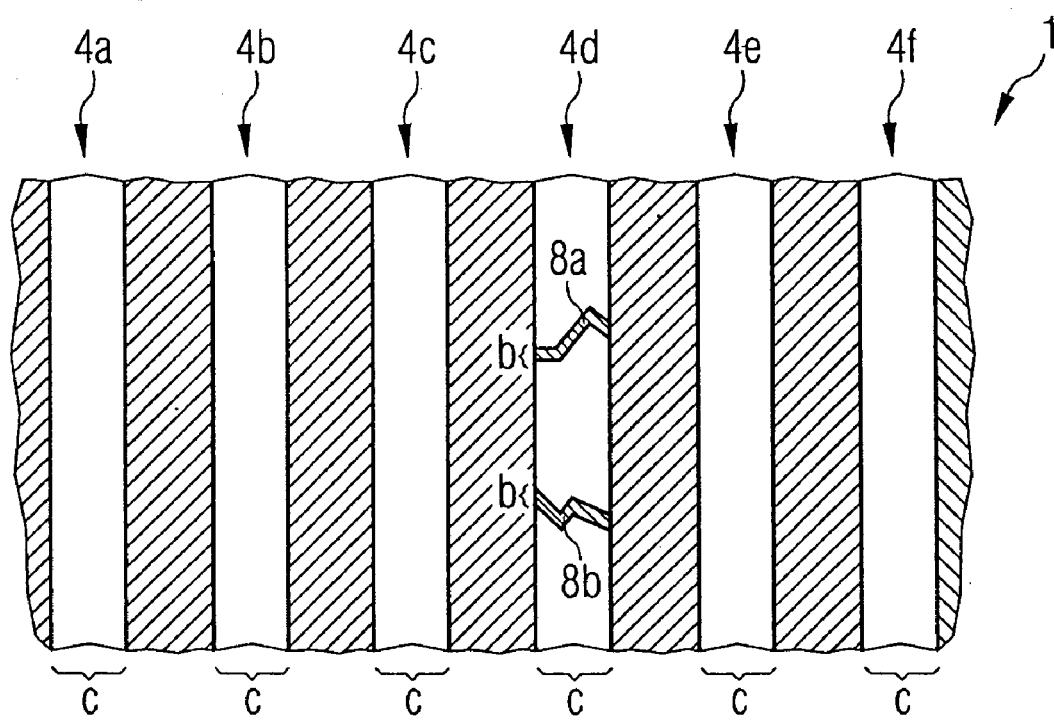
Figure 6A:
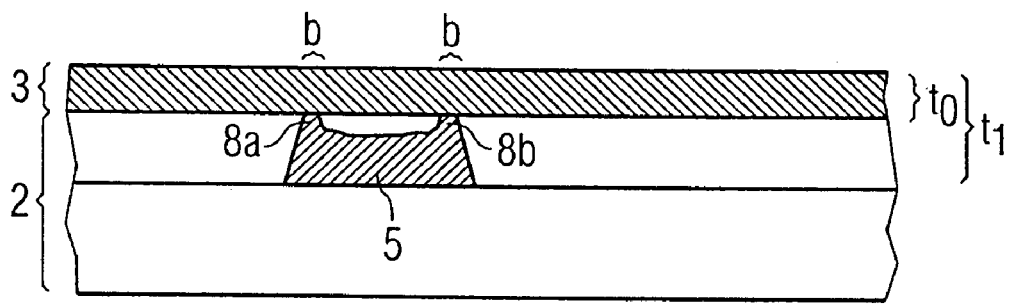
Figure 6B:
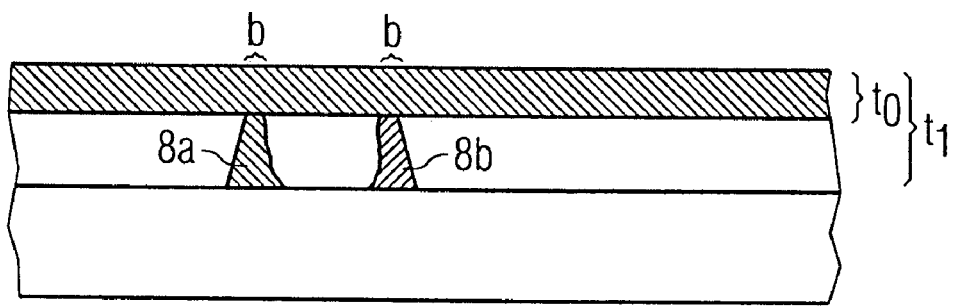
Figure 7:
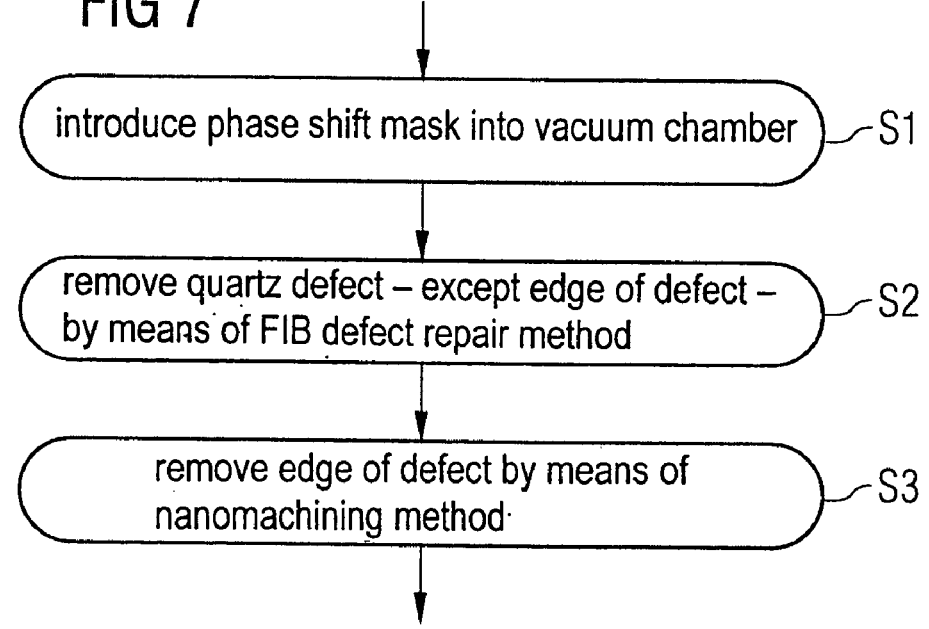

In the following, the invention will be explained in detail by means of an embodiment and the enclosed drawing. The drawing shows:

FIG. 1 a schematic cross-sectional view of a portion of an alternating phase shift mask with quartz bump;

FIG. 2 a schematic cross-sectional view of the phase shift mask portion with quartz bump as illustrated in FIG. 1, and of an AFM tip, for illustrating the method steps performed with a nanomachining defect repair method;

FIG. 3 a schematic cross-sectional view of the phase shift mask portion with quartz bump as illustrated in FIG. 1, and of an ion beam apparatus, a gas injector device, and a charge neutralization device, for illustrating the method steps performed with a FIB defect repair method;

FIG. 4 a schematic top view of the phase shift mask portion with quartz bump as illustrated in FIG. 1;

FIG. 5 a schematic top view of the phase shift mask portion with quartz bump as illustrated in FIGS. 1 and 4, after corresponding FIB defect repair method steps have been performed in accordance with an embodiment of the present invention;

FIG. 6a a perspective longitudinal-sectional view of the phase shift mask portion with quartz bump as illustrated in FIGS. 1 and 4, after the beginning of the FIB defect repair method steps performed in accordance with the embodiment of the present invention;

FIG. 6b a perspective longitudinal-sectional view of the phase shift mask portion with quartz bump as illustrated in FIGS. 1 and 4, after the end of the FIB defect repair method steps performed in accordance with the embodiment of the present invention; and FIG. 7 a flowchart for illustrating the basic sequence of the combined FIB/nanomachining defect repair method performed with the embodiment of the present invention.

FIG. 1 illustrates a schematic cross-sectional view of a portion 1 of an alternating phase shift mask.

The alternating phase shift mask is composed of two layers, namely a bottom quartz layer 2 and a chrome layer 3 positioned on top of the quartz layer 2.

During the manufacturing of the alternating phase shift mask, the (top) chrome layer 3 is first of all provided with a structure that corresponds to the structure that has to be provided on the wafer later on, wherein the chrome layer 3 is completely removed in the appropriate positions (cf. e.g. the structure lines 4a, 4b, 4c, 4d, 4e, 4f illustrated in FIGS. 1, 2, and 4 and positioned between the chrome positions that have been left).

Subsequently (again referring to FIG. 1), the quartz layer 2 is—additionally—etched away to a predetermined total depth $t_1$, but only at every second of the structure lines 4a, 4b, 4c, 4d, 4e, 4f provided.

At the structure lines 4a, 4b, 4c, 4d, 4e, 4f, the quartz layer 2 thus alternatingly exhibits either a—relatively small—total depth $t_0$, or a—relatively large—total depth $t_1$.

As is, for instance, illustrated in FIGS. 4 and 5, the structure lines 4a, 4b, 4c, 4d, 4e, 4f each may have e.g. a width c of approx. 200 nm–600 nm, wherein the width c may—depending on the optical device that is later on connected between a corresponding wafer and the phase shift mask—correspond to e.g. a fourth of the breadth of circuit paths that have to be manufactured later on by means of the alternating phase shift mask on the wafer.

During the manufacturing of alternating phase shift masks, defects in the structure of the quartz layer 2 may occur.

A corresponding particle positioned on the phase shift mask may, for instance, prevent the quartz layer 2 from being etched away in the region positioned under the particle. This causes an—undesired—elevation, i.e. a so-called quartz bump 5, to occur.

For repairing quartz bumps, the present embodiment of the invention uses a defect repair method wherein (for repairing one and the same quartz bump 5, or for repairing several or all quartz bumps of the phase shift mask) both a FIB defect repair method and a nanomachining defect repair method is used, i.e. a combined FIB/nanomachining defect repair method.

FIG. 2 illustrates a schematic cross-sectional view of the phase shift mask portion 1 with quartz bump 5 as illustrated in FIG. 1, and an AFM tip 6 (AFM=Atomic Force Microscope) used for performing a nanomachining defect repair method.

The AFM tip 6 may, for instance, be manufactured of diamond and is first of all moved from a position directly above the corresponding structure line 4d towards the bottom (cf. e.g. arrow A) until the lower end of the AFM tip 6 is on target level (i.e. has reached the desired depth $t_1$ of the quartz layer structure). Subsequently, the AFM tip 6 is reciprocated—at target level—such (cf. e.g. arrow B) that the quartz bump 5 or parts of the quartz bump 5 are removed.

As has already been mentioned, the present embodiment of the invention uses—in addition to a nanomachining method—additionally a FIB defect repair method for performing defect repair (i.e. a method based on focused ion beam (FIB)).

FIG. 3 illustrates a schematic cross-sectional view of the phase shift mask portion 2 with quartz bump 5 as illustrated in FIG. 1, and a FIB defect repair system 7 used for performing a FIB defect repair method.

This system comprises, in addition to the (actual) ion beam device 7a, a gas injector device 7b, and a charge neutralization device 7c.

As is further illustrated in FIG. 3, the alternating phase shift mask is introduced into a vacuum chamber for performing a FIB defect repair method, and subsequently—by means of the focused ion beam supplied by the ion beam device 7a—a gas supplied by the gas injector device 7b is spontaneously stimulated to etch at the position of the quartz bump 5, and the ion beam is—as illustrated by arrow C—reciprocated such that the quartz bump 5 or parts of the quarts bump 5, respectively, is/are removed by the etching process taking place.

In accordance with FIG. 7, as will be explained more exactly in the following, in the combined FIB/nanomachining defect repair method performed with the present embodiment—after introducing of the alternating phase shift mask into a corresponding vacuum chamber (step S1)—only the inner portion of a corresponding quartz bump 5 is removed first of all by means of a FIB defect repair method (i.e. not its edge regions 8a, 8b) (step S2), and subsequently the corresponding edge regions 8a, 8b of the quartz bump 5 are (also) removed by means of a nanomachining defect repair method (step S3).

FIG. 6a illustrates a perspective longitudinal sectional view of the phase shift mask portion 1 with quartz bump 5 as illustrated in FIGS. 1 and 4, after the beginning of the FIB defect repair method that is first of all performed in the case of the combined FIB/nanomachining defect repair method.

As is to be seen in FIG. 6a, (by placing the ion beam device 7a of the FIB defect repair system 7—illustrated in FIG. 3—at appropriate positions above the phase shift mask, or by reciprocating the ion beam in a corresponding manner, respectively) the inner portion of the quartz bump 5 is etched away (and, in accordance with FIG. 5, the edge regions of the quartz bump 5 directly adjacent to the edges of the structure or the structure line 4d, respectively), but not the edge regions 8a, 8b of the quartz bump 5 being positioned, in accordance with the representation shown in FIG. 5, at the front and at the back relative to the longitudinal direction of the corresponding structure line 4d.

By making use of a FIB defect repair method, the removal of the inner portion of the quartz bump 5 (and of the edge regions of the quartz bump 5 directly adjacent to the edges of the structure or of the structure line 4d, respectively) can be performed relatively quickly, and the quartz bump 5 can be removed neatly—close to the structure boundary—even in deep regions positioned close to the edges of the structure or the structure line 4d, respectively.

As is illustrated in FIG. 6b, in the present embodiment the inner portion of the quartz bump 5 (and, in accordance with FIG. 5, the above-mentioned edge regions of the quartz bump 5 directly adjacent to the edges of the structure line 4d) are removed to target level (i.e. to the desired total depth $t_1$ of the quartz layer 2 in the region of the structure line 4d) by means of the above-explained FIB defect repair method steps.

Contrary to this—as is also to be seen from FIG. 6b—the above-mentioned front or rear, respectively, edge regions 8a, 8b of the quartz bump 5 are left completely (or, alternatively (relative to the original height $t_1-t_0$ of the quartz bump 5) e.g. between 20% and 70%, in particular between 30% and 50%, of them are left).

In accordance with FIG. 5 and FIG. 6b, the breadth b of the—completely left—front or rear edge region 8a, 8b (measured at the top, plane boundary area of the respective edge region 8a, 8b) is substantially constant and may, for instance, be 10 nm–50 nm (or 100 nm, respectively).

Since the—front or rear, respectively—edge region 8a, 8b of the quartz bump 5 is left, the overetching occurring there with conventional FIB methods is avoided (i.e. the development of a "river bed").

After, in the above-described manner, the inner portion of the quartz bump 5 and its edge regions directly adjacent to the edges of the structure line 4d have been removed to target level by means of a FIB defect repair method (—and, possibly, in a corresponding way, i.e. by means of a FIB method, also with further, in particular with all, quartz bumps existing on the alternating phase shift mask, the inner portion and the corresponding edge regions directly adjacent to the edges of the respective structure line have been removed to the desired total depth $t_1$—), the corresponding edge regions 8a, 8b of the quartz bump(s) 5, which had first been left, are then (also) removed by means of a nanomachining defect repair method.

In so doing—after the alternating phase shift mask has been removed from the vacuum chamber—correspondingly similar as is illustrated in FIG. 2—the AFM tip 6 used for performing a nanomachining defect repair method is first of all moved from a position directly above the corresponding edge region 8a, 8b of the quartz bump 5 that has been left, towards the bottom (cf. e.g. arrow A) until the lower end of the AFM tip 6 is on target level (i.e. has reached the desired depth $t_1$ of the quartz layer structure).

Subsequently, the AFM tip 6 is reciprocated at target level (cf. e.g. arrow B) such that the corresponding edge region 8a, 8b of the quartz bump 5—which had first been left—is removed (as good as possible).

Subsequently, in a corresponding manner, i.e. by means of a nanomachining defect repair method, the edge regions that had been left are also removed to target level in the remaining quartz bumps existing on the alternating phase shift mask in addition to quartz bump 5.

Since the edge regions 8a, 8b of the quartz bump 5 that had first been left have relatively small dimensions, repair time and tip consumption can be reduced substantially with the combined FIB/nanomachining defect repair method vis-à-vis conventional nanomachining methods.

The invention claimed is:

1. A defect repair method, in particular for repairing quartz defects on alternating phase shift masks, for repairing one and the same defect, the method comprising:
performing defect repair method steps substantially based on etching processes; and performing defect repair method steps substantially based on mechanical processes thereafter, wherein the step of performing repair method steps substantially based on etching processes includes processing the defect in a central region of the defect to completely remove the defect in the central region and processing the defect in an edge region of the defect to partially remove the defect in the edge region, wherein in the edge region in relation to the original height of the defect, between 20% and 50% of the defect is not removed prior to the step of performing defect repair method steps substantially based on mechanical processes.

2. The defect repair method according to claim 1, wherein the defect repair method steps substantially based on mechanical processes are nanomachining method steps.

3. The defect repair method according to claim 2, wherein the defect repair method steps substantially based on etching processes comprise gas injection method steps.

4. The defect repair method according to claim 3, wherein the defect repair method steps substantially based on etching processes comprise a step of emitting ion beams.

5. The defect repair method according to claim 4, wherein the defect repair method steps substantially based on etching processes include FIB (Focused Ion Beam) method steps.

6. The defect repair method according to claim 1, wherein the defect is one of: a quartz defect and a quartz bump.

7. The defect repair method according to claim 1, wherein during the step of performing defect repair method steps substantially based on etching processes, a second defect is not repaired at an edge region.

8. The defect repair method according to claim 7, wherein at least 50% of the second defect is not removed at the edge region during the step of performing defect repair method steps substantially based on etching processes.

9. The defect repair method according to claim 1, wherein the defect repair method steps substantially based on etching processes comprise gas injection method steps.

10. The defect repair method according to claim 1, wherein the defect repair method steps substantially based on etching processes comprise a step of emitting ion beams.

11. The defect repair method according to claim 1, wherein the defect repair method steps substantially based on etching processes include FIB (Focused Ion Beam) method steps.

12. The defect repair method according to claim 1, wherein during the step of performing defect repair method steps substantially based on etching processes, a second defect is only partially repaired at an edge region.

13. The defect repair method according to claim 12, wherein the edge region of the second defect, which had been only partially repaired, is at least partially repaired during the subsequently performed defect repair method steps substantially based on mechanical processes.

14. The defect repair method according to claim 12, wherein at least 20% of the second defect is not removed at the edge region during the step of performing defect repair method steps substantially based on etching processes.

15. The defect repair method according to claim 14, wherein the edge region of the second defect, which had not been repaired, is at least partially repaired during the subsequently performed defect repair method steps substantially based on mechanical processes.

16. A method for repairing quartz defects on alternating phase shift masks comprising:
   etching away an inner portion of a quartz defect on an alternating phase shift mask completely;
   etching away an edge region of the quartz defect to remove between 30% and 80% of the edge region; and
   mechanically removing the remaining 20% to 70% of the edge region of the quartz defect.

17. The method of claim 16, wherein the step of etching away an edge region of the quartz defect includes etching away the edge region of the quartz defect to remove between 50% and 70% of the edge region and the step of mechanically removing includes mechanically removing the remaining 30% to 50% of the edge region of the quartz defect.

18. The method of claim 16, wherein the steps of etching away including emitting ion beams to the inner portion and the edge portion.

* * * * *